United States Patent
Faust et al.

(10) Patent No.: US 6,720,255 B1
(45) Date of Patent: Apr. 13, 2004

(54) SEMICONDUCTOR DEVICE WITH SILICON-CARBON-OXYGEN DIELECTRIC HAVING IMPROVED METAL BARRIER ADHESION AND METHOD OF FORMING THE DEVICE

(75) Inventors: Richard A. Faust, Dallas, TX (US); Noel M. Russell, Plano, TX (US); Li Chen, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/318,309

(22) Filed: Dec. 12, 2002

(51) Int. Cl.[7] .......................................... H01L 21/4763
(52) U.S. Cl. ..................... 438/637; 438/765; 438/798
(58) Field of Search ............................... 438/637, 643, 438/765, 770, 798

(56) References Cited

U.S. PATENT DOCUMENTS 6,511,909 B1 * 1/2003 Yau et al.

* cited by examiner

Primary Examiner—Phuc T. Dang
(74) Attorney, Agent, or Firm—Jacqueline J. Garner; W. James Brady, III; Frederick J. Telecky, Jr.

(57) ABSTRACT

A method (100) of fabricating an electronic device (200) formed on a semiconductor wafer. The method forms a dielectric layer (226) in a fixed position relative to the wafer, where the dielectric layer comprises an atomic concentration of each of silicon, carbon, and oxygen. After the forming step, the method exposes (118) the electronic device to a plasma such that the atomic concentration of carbon in a portion of the dielectric layer is increased and the atomic concentration of oxygen in a portion of the dielectric layer is decreased. After the exposing step, the method forms a barrier layer (120) adjacent at least a portion of the dielectric layer.

47 Claims, 6 Drawing Sheets

US 6,720,255 B1

SEMICONDUCTOR DEVICE WITH SILICON-CARBON-OXYGEN DIELECTRIC HAVING IMPROVED METAL BARRIER ADHESION AND METHOD OF FORMING THE DEVICE

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to semiconductor devices and methods and are more particularly directed to improving adhesion to a silicon-carbon-oxygen dielectric layer.

Semiconductor devices are prevalent in countless different aspects of contemporary society, and as a result, the marketplace for such devices continues to advance at a fairly rapid pace. This advancement is evident in many respects and relates to semiconductor devices either directly or indirectly as well as the methods for forming such devices. For example, the advancement affects numerous device attributes and increases the need for attention to such attributes during design and manufacturing, where such attributes include device size, reliability, yield, and cost. These aspects as well as others are addressed by the prior art and are further improved upon by the preferred embodiments as detailed below.

By way of further background, the preferred embodiments relate to adhesion to dielectric layers in semiconductor devices. More specifically, the preferred embodiments relate to a dielectric layer that includes all of silicon, carbon, and oxygen and the adhesion of such a layer to a barrier layer that is to operate as a barrier between the dielectric layer and a metal such as copper. Turning first to the dielectric layer having silicon, carbon, and oxygen, such materials are sometimes combined in a film known as organo-silicon glass ("OSG"), which is commercially available from Novellus and Applied Materials. OSG layers are attractive for various reasons known in the art, such as a favorable (i.e., relatively low) dielectric constant. Turning next to copper, its use is becoming more preferred in the art, particularly as an interconnect metal, because relative to previously used metals, such as aluminum, copper provides lower resistance and, hence, greater reliability.

Given the preceding, when copper is used in a same device as an OSG layer, typically a barrier layer is formed between the copper and OSG. The barrier layer prevents or reduces the undesirable chance of the Copper diffusing into the dielectric. However, in connection with the preferred embodiments, the present inventors have determined that when placing a barrier layer between OSG and copper, the adhesion of the barrier layer to the OSG has been unacceptable. For example, such adhesion has been empirically evaluated using several known testing techniques, and those techniques have demonstrated that the barrier layer will detach from the OSG, thereby failing to serve its underlying purposes as a barrier to a subsequently-formed copper layer/device. For example, tape testing has been used, wherein a semiconductor wafer, on which a barrier layer is formed on an OSG layer, is scribed and then tape is applied to the wafer and removed to determine if the layers remain intact. Under such testing, cracks have been found to form at the interface of the barrier layer and the OSG layer, thereby demonstrating qualitatively that the bond between the two layers is unacceptable. As another example, four point bend testing has been performed, wherein a same type of semiconductor wafer as described above is subjected to flexing forces at its ends, in combination with other forces applied more centrally to the wafer. Using this test, a quantitative measure is made to determine the end-applied force at what there is a failure between the OSG and the barrier layer, where such a failure may occur as a crack or break of the barrier layer, or the barrier layer may delaminate from the OSG layer. As a final test, chemical mechanical polishing ("CMP") may be applied to the above-described wafer. This test is sometimes preferred in that it represents an actual manufacturing step, since CMP is often used to planarize various layers before subsequent processing steps. In any event, under CMP, the present inventors also have observed failures between an adjacent OSG and barrier layer.

In view of the above, the present inventors provide below alternative embodiments for improving upon various drawbacks of the prior art.

BRIEF SUMMARY OF THE INVENTION

In one preferred embodiment, there is a method of fabricating an electronic device formed on a semiconductor wafer. The method forms a dielectric layer in a fixed position relative to the wafer, where the dielectric layer comprises an atomic concentration of each of silicon, carbon, and oxygen. After the forming step, the method exposes the electronic device to a plasma such that the atomic concentration of carbon in a portion of the dielectric layer is increased and the atomic concentration of oxygen in a portion of the dielectric layer is decreased. After the exposing step, the method forms a barrier layer adjacent at least a portion of the dielectric layer.

Other aspects are also disclosed and claimed.

DETAILED DESCRIPTION OF THE INVENTION

Figure 1:
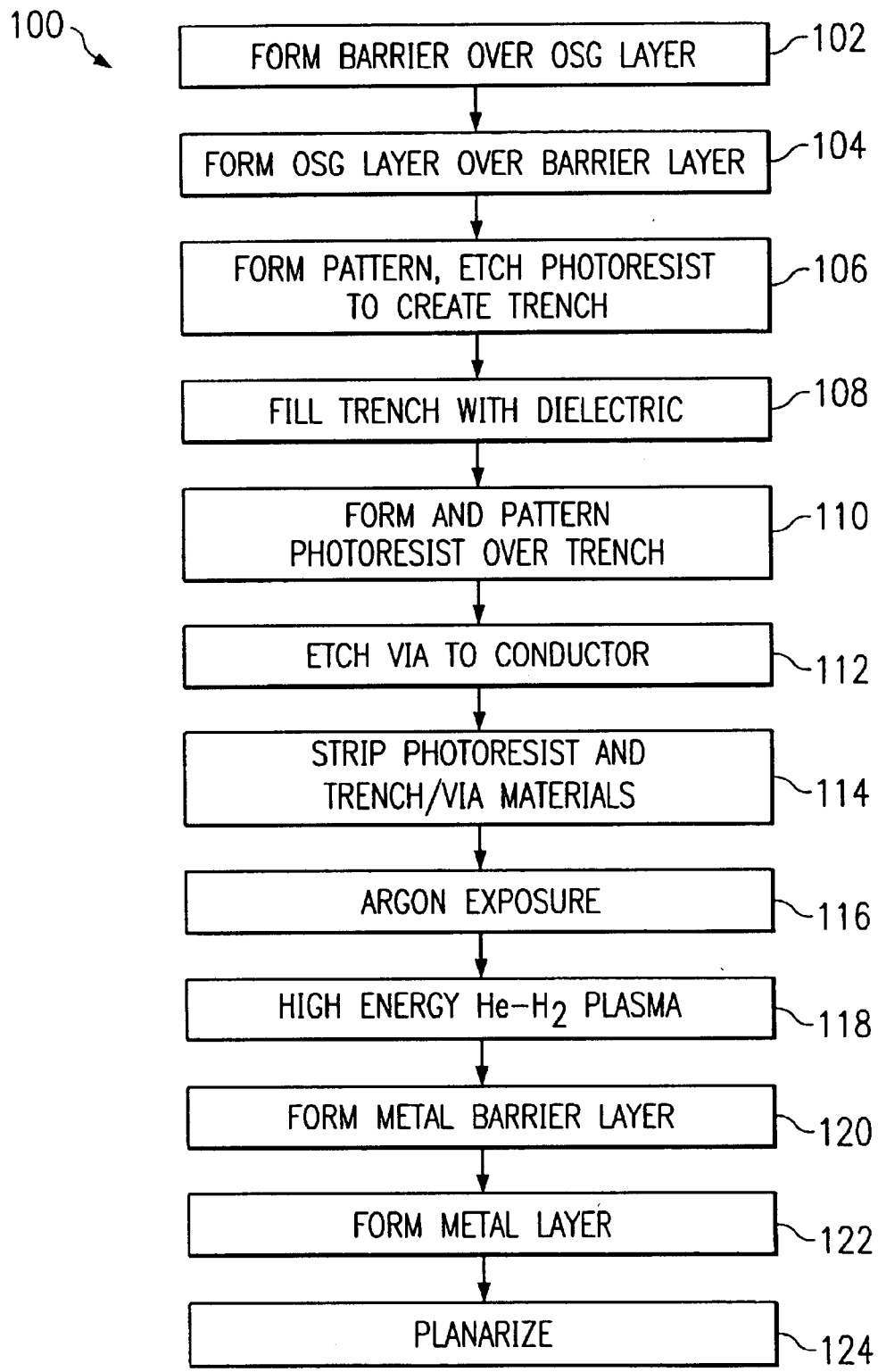
FIG. 1 illustrates a flow chart of one preferred embodiment for forming a device that includes a barrier layer adjacent a dielectric layer that includes silicon, carbon, and oxygen. The embodiment described here is often called dual damascene and can be formed with many variations. The invention also includes structures that are formed by a single damascene process where the trench and via levels are formed separately.

FIG. 1 illustrates a flow chart of one preferred embodiment of a method 100 for forming a device according to the preferred embodiment. To further illustrate method 100 and the device that it forms, the various steps of method 100 are discussed below with additional reference to the cross-sectional views shown in FIGS. 2 through 11, as will further demonstrate the inventive scope.

Figure 2:
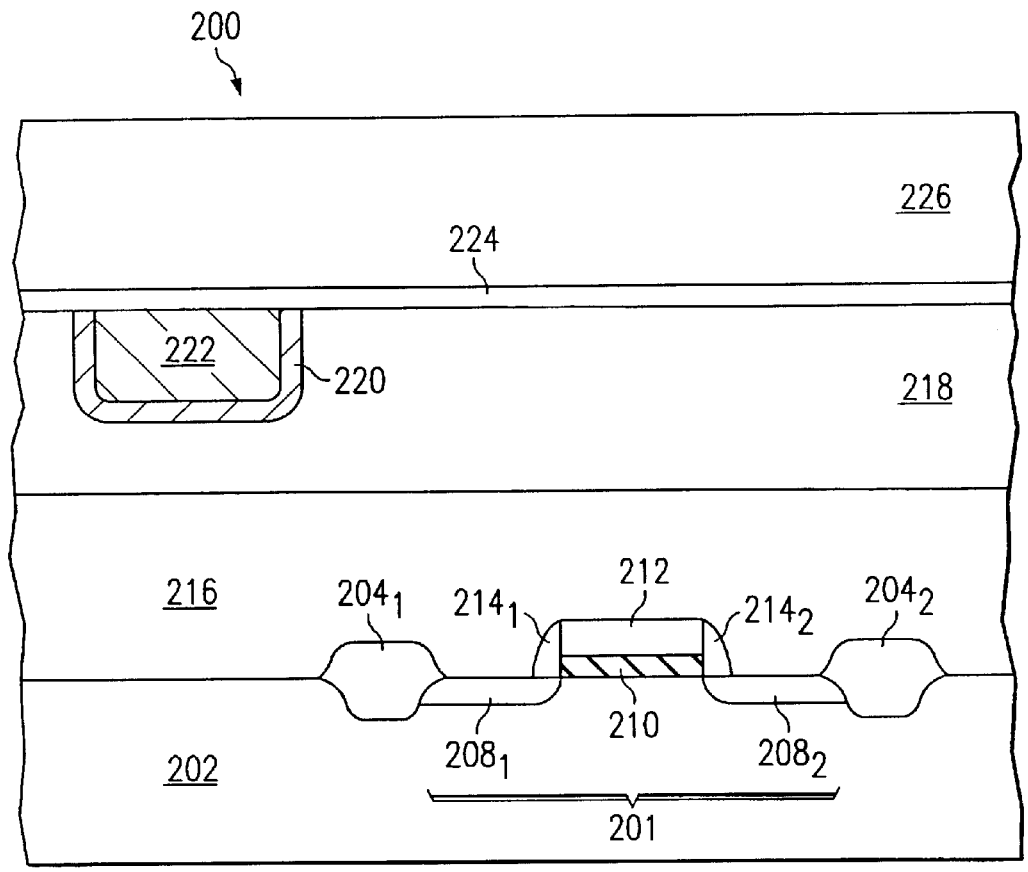
FIG. 2 illustrates a cross-sectional view of a portion of a semiconductor device according to the preferred embodiment and including a substrate in which a transistor is formed, and overlying the transistor is a dielectric layer in which a metal conductor is formed.

The preferred embodiments relate in part to the treatment of a dielectric layer that includes silicon, carbon, and oxygen, where such materials are sometimes combined in a film known as organo-silicon glass ("OSG"). OSG layers may appear at various levels in a semiconductor device and, thus, by way of introduction, an example for use in subsequent discussion is now provided with reference to FIG. 2 which illustrates a semiconductor device 200. Further, both the prior art and the inventive embodiments described below may be implemented in connection with a structure such as is shown in FIG. 2, where further elaboration for additional processing steps is provided below according to the preferred embodiments. Additionally, while the methods of the preferred embodiments are described with reference to FIGS. 2 through 11, those methods may be applied to any type of device structure (e.g., metal interconnects, metal lines, metal gates, or other conductive structures) and to any type of device (e.g. memory devices, logic devices, power devices, digital signal processors, or microprocessors) in which an OSG layer benefits from improved adhesion to an adjacent barrier layer.

Turning first to device 200 of FIG. 2, it includes various device components that are formed as is known in the art, and which may form various devices such as a transistor as shown by way of example formed in connection with an active area 201 formed in a substrate 202 (e.g., silicon). Substrate 202 is part of, or represents, a semiconductor wafer providing the foundation for device 200. Further, the wafer may be enclosed within one or more tools as further discussed below to accomplish the various steps described in this document. Active area 201 is generally defined between isolation regions $204_1$ and $204_2$. Within active area 201, source and drain regions $208_1$ and $208_2$, a gate dielectric 210, a conductive gate 212, and sidewall insulators $214_1$ and $214_2$ are formed, thereby creating a transistor by way of example. A dielectric layer 216 is formed overlying the transistor shown therein and is planarized, where dielectric layer 216 therefore overlies the portion of the device containing active (and possibly passive) components formed as is known in the art. A second dielectric layer 218 is shown to overlie dielectric layer 216, although in fact layers 216 and 218 may be one layer.

Continuing with FIG. 2 and the additional items therein, note that multiple levels of interconnect structure may be formed and may connect to one another and also to various of the components formed in relation to substrate 202. Due to the many possibilities of the connections that may be achieved by such interconnect structures and the components to which they may connect, considerable extra detail is not necessary with respect to a specific connection as it may be readily ascertained by one skilled in the art. Thus, only a particular example is provided below merely to demonstrate a context and not by way of limitation for the intended inventive scope. For the specific example, a liner/barrier layer 220 is formed within a trench structure formed in dielectric layer 218, where liner/barrier layer 220 may be one of various materials including tantalum, tantalum nitride, titanium nitride, tungsten, tungsten nitride, and still others. Further, a conductor 222 is formed to align with liner/barrier 220 and is planarized along the top surface of dielectric layer 218. By way of example, assume that conductor 222 is copper, although it may be formed from other conducting materials. Thereafter, a barrier layer 224, often referred to as an etch stop layer and commonly on the order of a few hundred angstroms of silicon nitride or another dielectric barrier material, is formed over dielectric layer 218 and, thus, also over the top of conductor 222.

The remaining illustration of FIG. 2 introduces aspects particularly relevant to the preferred embodiment. Overlying barrier layer 224 is formed a dielectric layer 226. This dielectric layer 226 could be deposited by Chemical Vapor Deposition ("CVD"), spin on process, or another deposition process. The thickness of dielectric layer 226 is based upon performance requirements Further, dielectric layer 226 preferably has a relatively low dielectric constant and is formed of OSG, that is, it includes some combination of at least silicon, carbon, and oxygen. For sake of simplified reference, therefore, for the remainder of this document dielectric layer 226 is referred to as OSG layer 226. As detailed below, the preferred embodiments relate to improving adhesion of a subsequent barrier layer to OSG layer 226. Further in this regard and for the sake of simplifying the remaining Figures, much of the detail from FIG. 2 is removed from the following Figures by illustrating cutaway depictions from layer 218 upward, where the focus therefore is with respect to OSG layer 226; however, one skilled in the art should appreciate that the configurations illustrated in the remaining Figures are intended to also include the devices of FIG. 2 (or other devices, as mentioned above).

Figure 3:
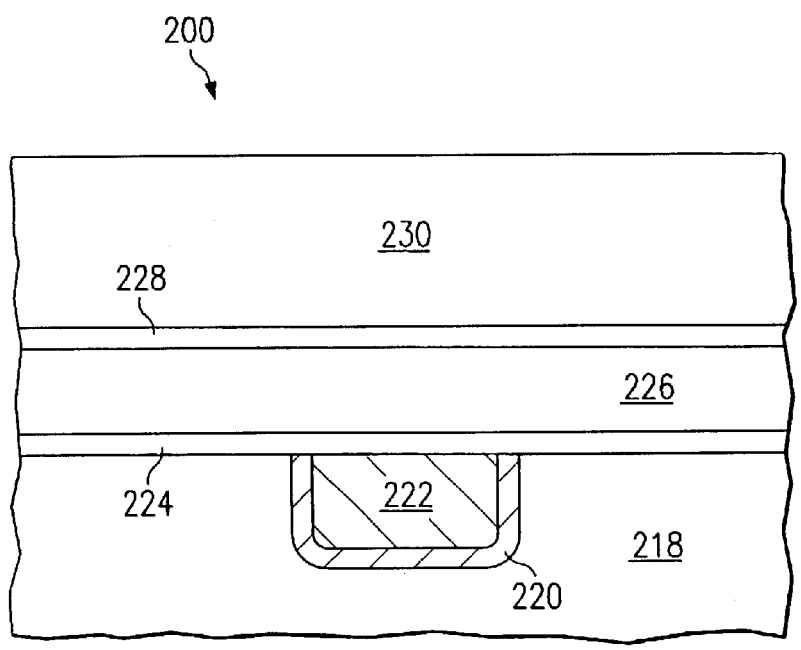
FIG. 3 illustrates a portion of the device of FIG. 2 and including the metal conductor as covered by a first barrier layer, where the first barrier layer is covered by a first silicon-carbon-oxygen containing layer, and the first silicon-carbon-oxygen containing layer is covered by both a second barrier layer and a second silicon-carbon-oxygen containing layer.

Looking to FIG. 3, it illustrates device 200 of FIG. 2 after additional fabrications steps which are now explored also by returning to method 100 of FIG. 1. By way of further introduction, as a contemporary example method 100 includes the steps to form a so-called dual damascene structure, where that name typically refers to the formation of a void within device layers, where the void includes two portions. These two portions are sometimes referred to using different names, where by way of example a generally vertical and narrower void is sometimes referred to as a via and a generally horizontal and often wider void is referred to as a trench. The dual damascene process in general is known in the art, and indeed it may be achieved with different steps, or with comparable steps in varying orders, and sometimes with or without certain barrier layers. Thus, method 100 with respect to the dual damascene aspects is only by way of example. Given this background, method 100 commences with a step 102 where a barrier layer 228 is formed overlying OSG layer 226. Barrier layer 228, by way of example, may be formed in the same or a similar manner as barrier layer 224 and, thus, forms an etch stop layer typically on the order of a few hundred angstroms of silicon nitride. Following step 102, step 104 forms an additional dielectric layer 230 on top of barrier layer 228. In the preferred embodiment, dielectric layer 230 is formed of the same OSG material as was layer 226. The thickness of dielectric layer 230 may be the same or differ from that of dielectric layer 226. Also for sake of reference, in the remainder of this document dielectric layer 230 is referred to as OSG layer 230.

Figure 4:
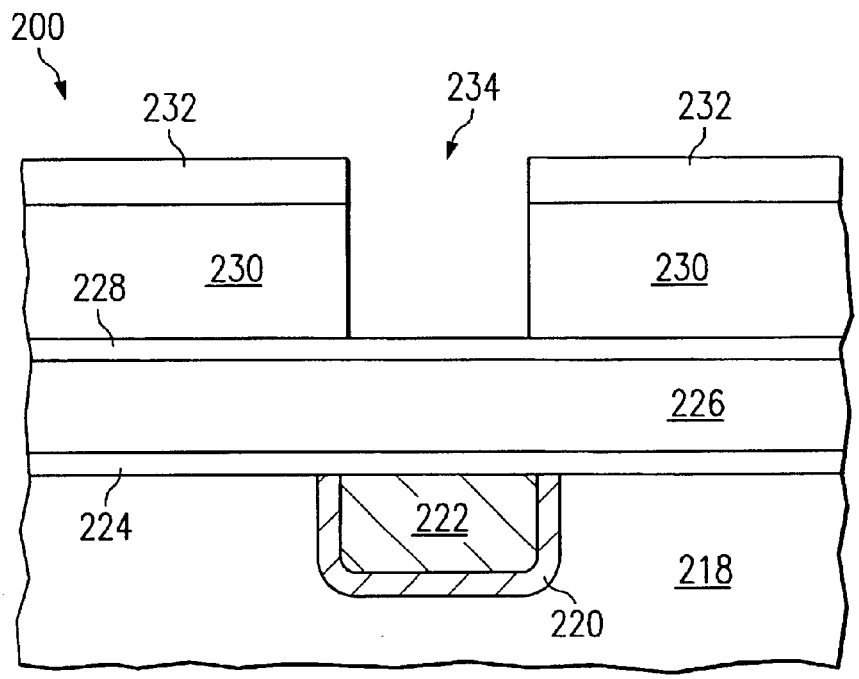
FIG. 4 illustrates the device of FIG. 3 after additional fabrications steps, including the formation of a photoresist layer and an etch through that photoresist layer down to the second barrier layer to form a trench through the second silicon-carbon-oxygen containing layer.

FIG. 4 illustrates device 200 of FIG. 3 after additional fabrications steps, and according to techniques known in the art. Continuing with method 100, in step 106 a photoresist layer 232 is formed, patterned and etched. Thus, in the perspective of FIG. 4, all three steps have been performed with respect to photoresist layer 232, thereby forming a first void 234, sometimes referred to as a trench, through OSG layer 230 and stopping on barrier (or etch stop) layer 228. Lastly, for reasons more clear below, the patterning and etching to form void 234 are preferably such that the void vertically aligns at least in part with conductor 222.

Figure 5:
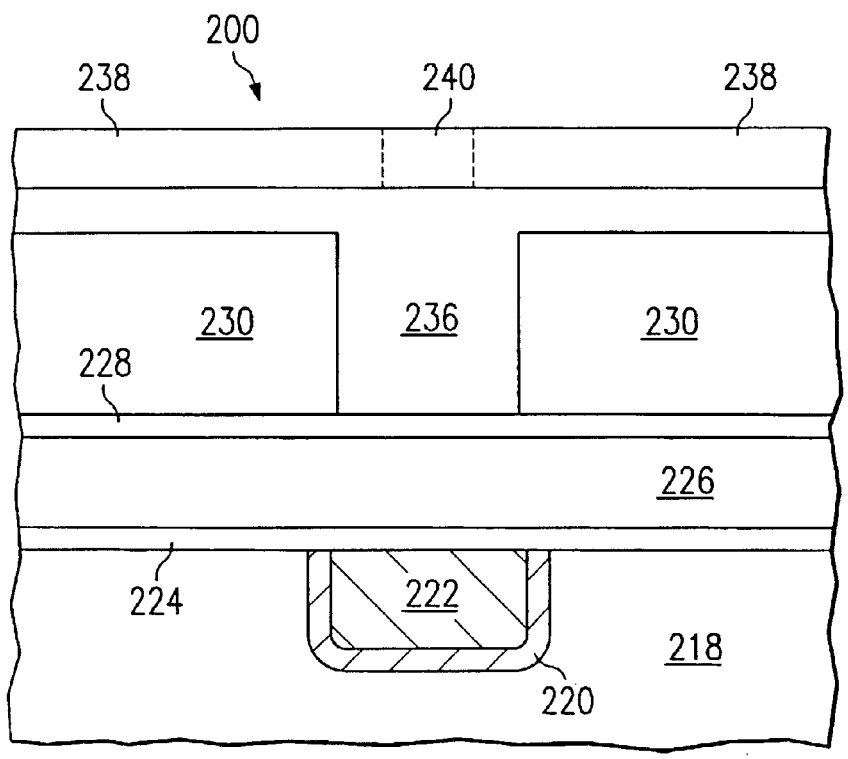
FIG. 5 illustrates the device of FIG. 4 after additional fabrications steps, including the formation of a photoresist.

FIG. 5 illustrates device 200 of FIG. 4 after additional fabrications steps, and according to techniques known in the art. Continuing with method 100, in step 108, the remainder of photoresist layer 232 from FIG. 4 is stripped (with an appropriate cleaning step, if desired), and an additional dielectric layer 236 is formed over device 200 and so that it fills void 234 which was shown in FIG. 4. Next, in a step 110, another photoresist layer 238 is formed and patterned. Photoresist layer 238 is patterned such that is an area 240 will be removed in a subsequent etch, as described below. Further, area 240 is also preferably vertically aligned at least in part with conductor 222, as well as with the area in which void 234 from FIG. 4 was filled with dielectric layer 236.

Figure 6:
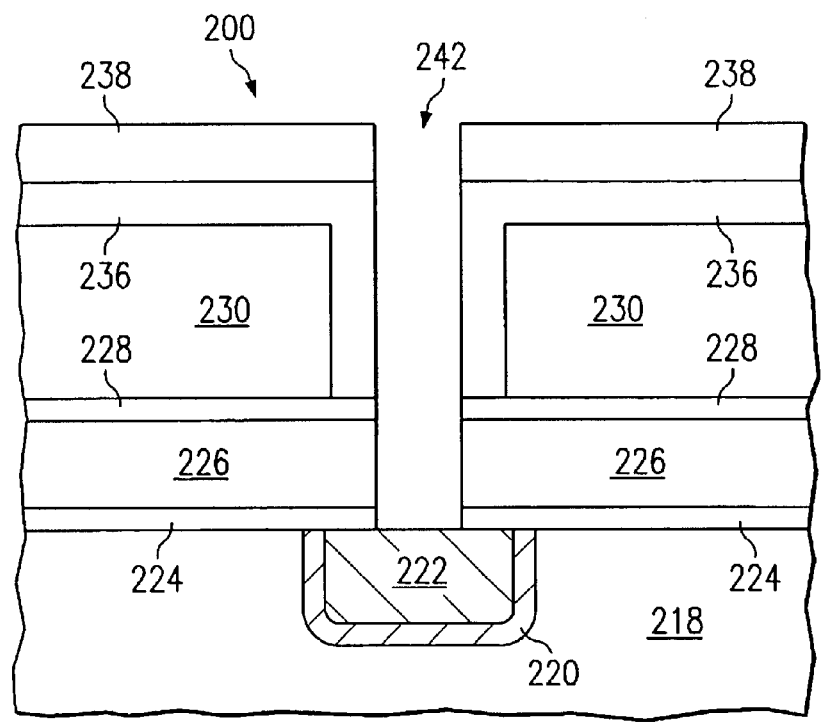
FIG. 6 illustrates the device of FIG. 5 after additional fabrications steps, including an etch to form a via through the first silicon-carbon-oxygen containing layer and down to the metal contact.

FIG. 6 illustrates device 200 of FIG. 5 after additional fabrications steps, and according to techniques known in the art. Continuing with method 100, in step 112, photoresist layer 238 is etched such that the material of that layer is removed from area 240 as was shown in FIG. 5, and the etch continues to create a void 242, sometimes referred to as a via, through all of dielectric layer 236, barrier layer 228, OSG layer 226, and barrier layer 224; thus, the etch reaches the upper surface of conductor 222. Accordingly, and as shown below, electrical contact ultimately can be made in the area of trench 242 to conductor 222.

Figure 7:
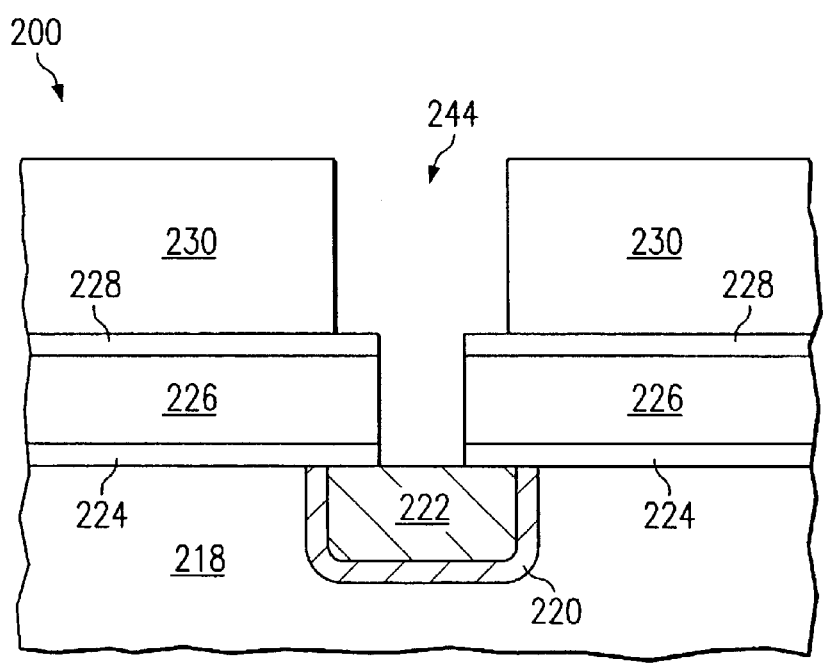
FIG. 7 illustrates the device of FIG. 6 after a strip of both the photoresist and a dielectric layer.

FIG. 7 illustrates device 200 of FIG. 6 after additional fabrications steps, and according to techniques known in the art. Continuing with method 100, in step 114, both photoresist layer 238 and dielectric layer 236, as were shown in FIG. 5, are stripped from device 200. Since these two layers are formed from different materials, different stripping techniques may be employed. In any event, once they are removed, a single void 244 remains through OSG layers 230 and 226 to an upper surface of conductor 222. Note that void 244 effectively includes two portions, one with a narrower width closer to conductor 222 as between the etched portions of OSG layer 226 and another with a wider width as between the etched portions of OSG layer 230 and away from conductor 222; this double-tier structure is the result of a typical dual damascene process.

Figure 8:
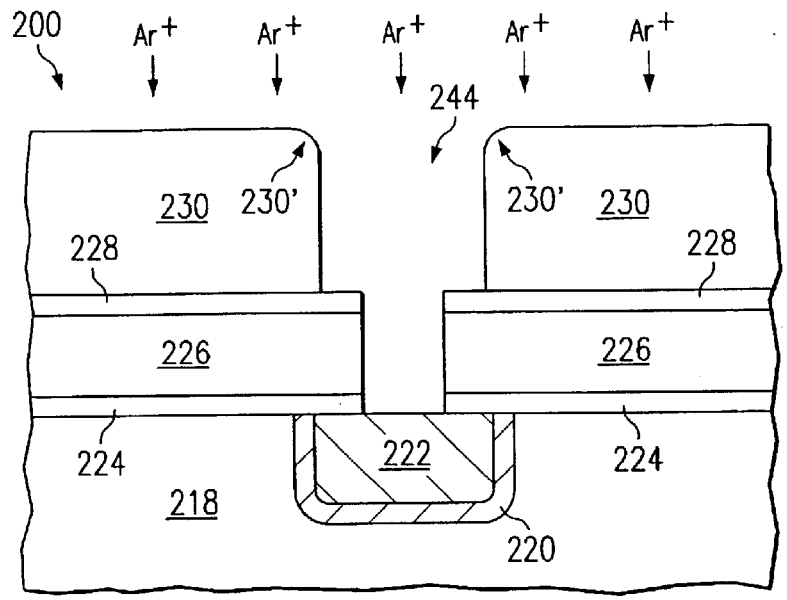
FIG. 8 illustrates the device of FIG. 7 subjected to an argon plasma.

FIG. 8 illustrates device 200 of FIG. 7 after additional fabrications steps, but note here that various of the remaining steps provide a departure from the prior art and further provide for improved adhesion to the exposed vertical and horizontal portions of OSG layers 230 and 226, as between those portions and a later-formed barrier layer. Turning then to FIG. 8 and also continuing with method 100 in FIG. 1, in step 116, device 200 is exposed to argon, preferably in an argon sputter etch process. Such a process is typically achieved in a sputter etch chamber where the argon ions are accelerated onto the wafer in which device 200 is formed. The argon sputter of step 116 is perceived to have various benefits. First, the argon cleans various contaminants that are likely to remain on the upper surface of conductor 222, as resulting from preceding method 100 steps. Such contaminants may include etch residue and polymers from previous etches, as well as copper oxide in the case where conductor 222 is copper. Second, the argon sputter will slightly round the inward edges of OSG layer 230, where such edges are shown as 230' in FIG. 8. For reasons discussed below, such rounding may be beneficial in certain embodiments. Lastly, note that step 116 in most practical implementations is desirable due to the high probability of the existence of contaminants once void 244 is formed. However, the necessity as well as duration of step 116 may be adjusted based on various parameters, including whether the void is formed by a single or dual damascene process. Indeed, if the previous steps were followed by sufficient cleaning operations such that the contaminants with void 244 were negligible, then in such a case, step 116 could be eliminated in an alternative embodiment.

Figure 9:
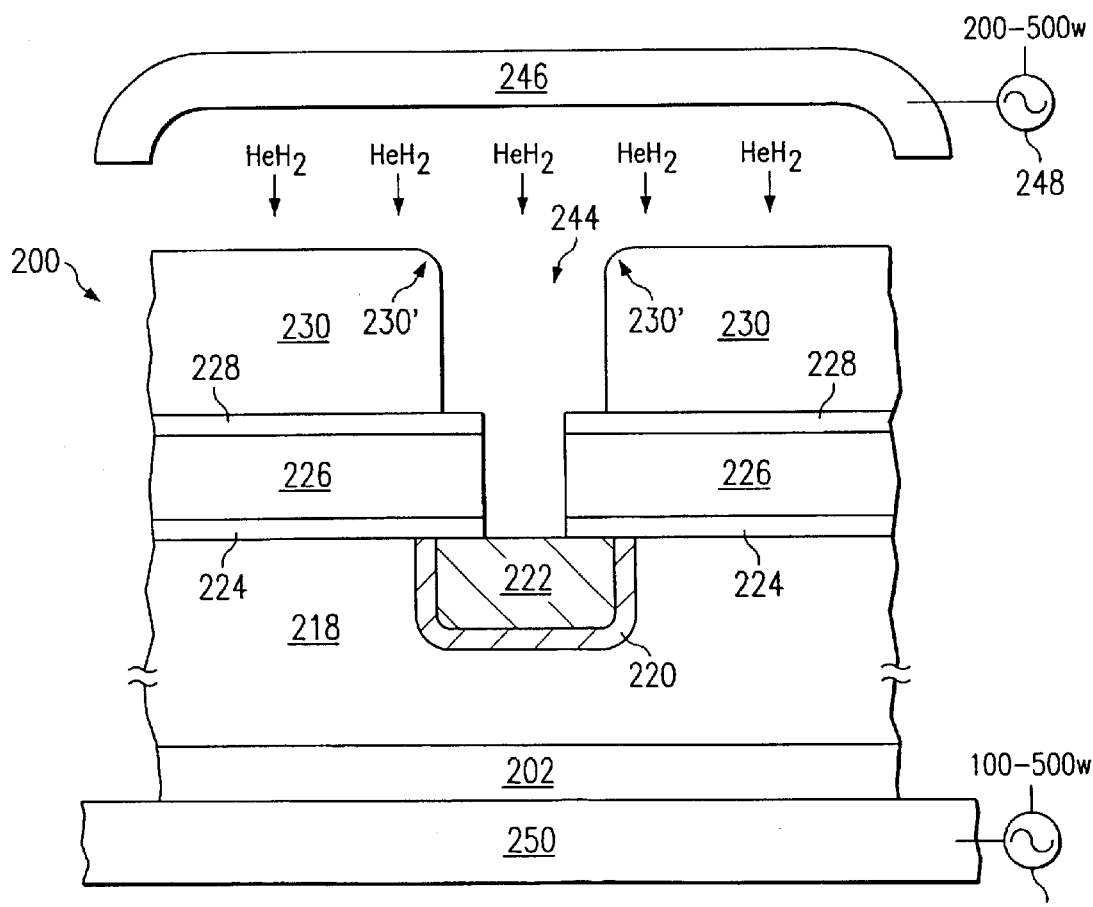
FIG. 9 illustrates the device of FIG. 8 subjected to a high energy He—$H_2$ plasma

FIG. 9 illustrates device 200 of FIG. 8 after additional fabrications steps, as described in method 100 in FIG. 1 with respect to step 118. In step 118, which further departs from the prior art, device 200 is exposed to a plasma containing He and $H_2$, where the percentage of each of the two may vary. For example, in the prior art, a plasma including He and $H_2$, where the He provides 95% and the $H_2$ provides 5% of the mixture, has been implemented by Applied Materials at very low pedestal power (on the order of 10 Watts) to reduce copper oxide on the top of conductors such as conductor 222. Further, the prior art He—$H_2$ plasma is implemented by ionizing that plasma by applying a power source to the chamber coil in which the plasma is formed, where the power source is on the order of 200 to 500 Watts. Returning to step 118, this same mixture of 95% He and 5% $H_2$ may be used in step 118, or a different percentage of He and $H_2$ may be used, also in combination with a comparable power configuration and source for ionizing the plasma. Toward this end, FIG. 9 includes a block depiction of a chamber coil 246 with a power source 248 connected to coil 246, where such a configuration is known in the art. Further, power source 248 is preferably set in the range of 200 to 500 Watts, which is in a comparable range to that used in the prior art. However, step 118 contrasts to the prior art in at least one of two respects in the preferred embodiments. First, in the preferred embodiment, the He—$H_2$ plasma of step 118 is in addition to the argon treatment of step 116. Second, the plasma of step 118 is accelerated toward the wafer, in which device 200 is formed, by applying a relatively large power to a pedestal 250 that supports substrate 202; to illustrate this aspect, FIG. 9 illustrates pedestal 250 in general, where one skilled in the art should be readily familiar with such an apparatus in an appropriate plasma chamber for accomplishing step 118. Further in this regard, pedestal 250 is coupled to a power source 252, and preferably in step 118 power source 252 provides a power level anywhere in the range of 100 to 500 Watts. The duration of step 118 may vary according to the preferred embodiment.

Preferably, such duration is timed in order to cause the plasma to affect only a certain depth from each exposed surface of OSG layers 226 and 230. For example, preferably the effect is realized in approximately 10 Angstroms of these layers, and the present inventors have observed an effect of approximately 1 Angstrom per second; as such, to affect 10 Angstroms, then the plasma acceleration of step 118 is performed over a 10 second interval. Also in this regard, the preferred embodiments also contemplate an upper limit on the duration of step 118. Specifically, and as shown below, in some locations the area of OSG layer 230, as affected by the step 118 He—$H_2$ plasma, is subsequently removed and thus the depth of penetration of the step 118 plasma may be compensated for by this removal. However, in other exposed areas, such removal does not occur and, therefore, attention should be provided to these areas as well as the effects, if any, by permitting the step 118 plasma to reach levels such that a greater depth of OSG is affected. For example, by permitting the step 118 duration to extend too long, there is the possibility of increasing capacitance between conductor 222 and any nearby comparable contact (not explicitly shown). To avoid such effects, therefore, the step 118 duration and its corresponding depth of effect should be monitored.

Before proceeding with additional steps, some observations with respect to the results achieved by step 118 are noteworthy. In response to the increased power of step 118 as applied to pedestal 250 versus that of the prior art, the He—$H_2$ plasma is accelerated downward toward the exposed areas of device 200, including OSG layers 230 and 226. With respect to the OSG layers 230 and 226, the present inventors have observed that step 118 thereby alters the atomic concentration of the silicon, carbon, and oxygen near the exposed surfaces (both vertical and horizontal) of these layers. For example, in one empirical study, where OSG layers 230 and 226 prior to step 118 were originally found to have a relatively large atomic concentration of oxygen, a relatively low concentration of carbon, and a concentration of silicon between that of the carbon and oxygen, following step 118 the concentrations are changed near the exposed surfaces of layers 230 and 226 such that the carbon concentration is increased, the oxygen concentration is decreased, and the silicon is also increased, as compared to their respective concentrations prior to that step. The present inventors believe in connection one or more of these concentration changes that better adhesion is permitted between the surface of both OSG layers 230 and 226 to a subsequent metal layer, as further appreciated below. Additionally, under the preferred embodiments, the argon treatment of step 116 is found to remove copper oxide from the upper surface of metal conductor 222, but some of that material is found to remain along the vertical sidewalls of OSG layer 226 in the area of void 244. However, the treatment of step 118 is believed to reduce the oxygen in these sidewall areas as well, thereby providing an improved metal conductor in that area in combination with the additional metals as described below. Lastly, it is noted that the step 118 plasma has only a minimal affect on the metal in the upper surface of conductor 222, when that conductor is formed of copper.

Figure 10:
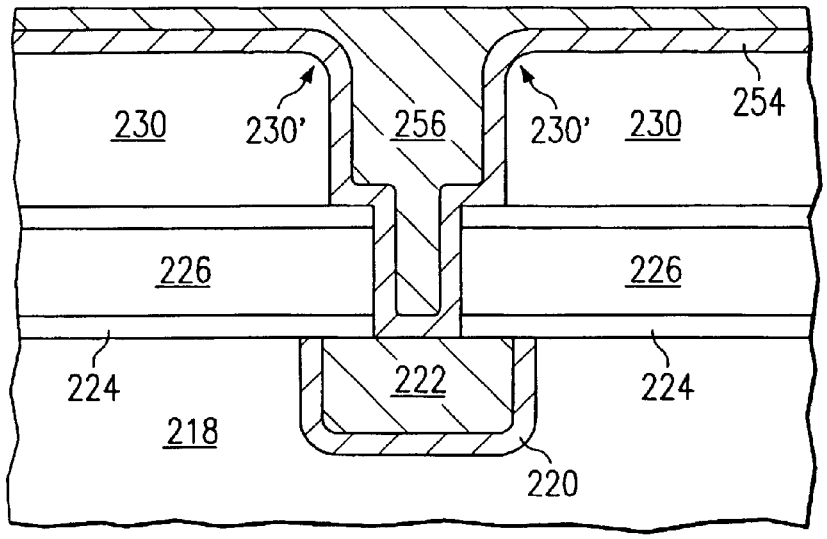
FIG. 10 illustrates the device of FIG. 9 after the formation of a metal barrier layer and a copper layer.

FIG. 10 illustrates device 200 of FIG. 9 after additional fabrications steps, as described in method 100 in FIG. 1 with respect to step 120. In step 120, a conductive barrier layer 254 is formed within what is shown as void 244 in the preceding FIG. 9. Barrier layer 254 may be of various materials, such as tantalum by way of example. In the preferred embodiment, the thickness of barrier layer 254 may be on the order of 250 Angstroms. However, with a continuing trend of reduced device sizes, there is stated in the industry a goal to achieve so-called "zero barrier" status. In the meantime, reducing the thickness of barrier layers is a goal and, indeed, it is believed in connection with the preferred embodiments that the thickness of barrier layer 254 also may be reduced. For example, satisfactory device yields have been found with a thickness of barrier layer 254 as low as 50 Angstroms. More specifically, with the changes in atomic concentration in OSG layers 226 and 230 as described above, even at such a reduced thickness there has been confirmed an adequate adhesion between barrier layer 254 and the materials below that layer, unlike the prior art where such adhesion broke down as described in the Background Of The Invention section of this document.

Continuing with FIG. 10, and as shown in method 100 of FIG. 1, a step 122 follows step 120 and in which a metal layer 256 is formed over device 200, extending into what was shown as void 244 in the preceding FIG. 9. In the preferred embodiment, metal layer 256 is copper, and it is formed by first providing a copper seed layer (not separately shown) in void 244 and on top of barrier layer 254, and following the copper seed layer with a copper plating step. In connection with these layers, recall that the argon step 116 above was stated to be favorable in causing rounded edges 230'. Without such edges 230', the inclusion of barrier layer 254 as well as a copper seed layer would otherwise tend to converge on or pinch off the vertical opening in void 244 and, as a result, the subsequent metal layer 256 may not fully fill that area—such a result is sometimes referred to as creating a cavity within the metal layer. However, looking to FIG. 10, it is seen that the entire void 244 is filled by metal layer 256 because rounded edges 230' permit a thorough filling of void 244 by metal layer 256. As another observation, given the status of the formation of device 200 in FIG. 10, it may be further seen that barrier layer 254 provides a barrier between metal layer 256 and the OSG layers 230 and 226. Thus, in the preferred example where metal layer 256 is copper, then barrier layer 254 prevents copper diffusion of metal layer 256 into OSG layers 230 and 226. However, recalling that step 118 alters the concentrations of the copper and oxygen in those OSG layers 230 and 226, it is contemplated that in future embodiments layer 254 may be reduced still further in thickness, while the changed concentrations themselves also may thwart copper diffusion by metal layer 256; in this manner, again there is an advancement toward the goal of a zero barrier.

Figure 11:
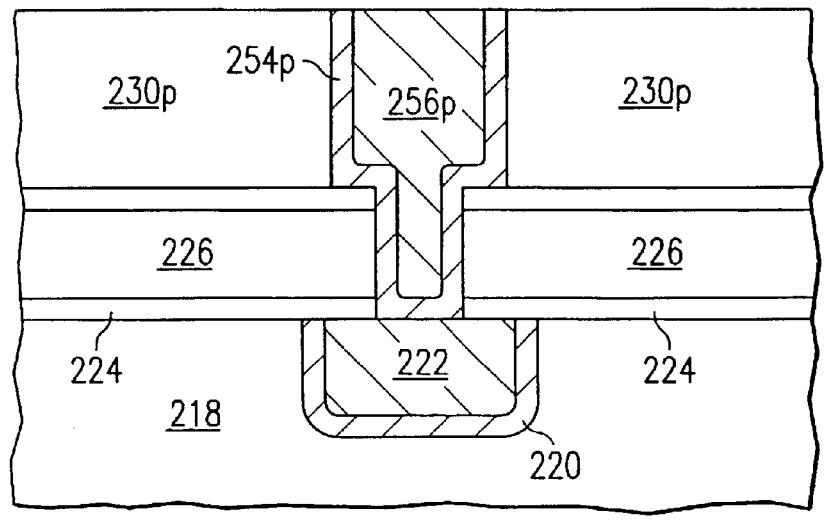
FIG. 11 illustrates the device of FIG. 10 after a planarization step.

FIG. 11 illustrates device 200 of FIG. 10 after additional an fabrication step, as described in method 100 in FIG. 1 with respect to step 124. In step 124, device 200 is planarized, such as with a chemical mechanical polishing ("CMP") operation. For sake of reference, the layers affected by the planarization are shown with a subscript "P" in their reference numbers. Thus, following the planarization, OSG layer 230 becomes an OSG layer $230_P$, metal barrier layer 254 becomes metal barrier layer $254_P$, and metal layer 256 becomes metal layer $256_P$. Accordingly, from the resulting structure of device 200 in FIG. 11, electrical contact may be made to metal layer $256_P$, thereby also electrically connecting to metal conductor 222. Lastly, recall it is stated above in connection with step 118 that the duration of the He—$H_0$ plasma exposure will control the depth at which the concentration of OSG layer 230 is affected; in the preferred embodiment, that affected depth is either partially or entirely removed by the CMP operation of step 124 and, thus, any effects of that treatment along the upper horizontal surface of OSG layer 230 are effectively removed by the CMP. However, below that surface, there is still improved adhesion between OSG layer 230$_P$ and metal barrier 254$_P$, where such improvements have been confirmed through the various manners of testing described earlier in this document.

From the above, one skilled in the art should appreciate that the preferred embodiments provide for semiconductor devices and methods with improved adhesion between a metal and a silicon-carbon-oxygen dielectric layer. This improved adhesion provides numerous benefits, including device reliability, yield, and cost, and possibly reducing device size by reducing barrier thickness. Further, while certain preferred materials have been described, one skilled in the art may ascertain various alternatives that also may be implemented within the inventive teachings. Additionally, while the preceding embodiment has been shown as one type of dual damascene structure, other dual damascene structures may be formed with many variations and still fall within the inventive scope and, indeed, that scope also includes structures that are formed by a single damascene process where the trench and via levels are formed separately. Thus, the preceding benefits as well as the various alternative steps described and ascertainable by one skilled in the art demonstrate the flexibility of the inventive scope, and they should also demonstrate that while the present embodiments have been described in detail, various substitutions, modifications or alterations could be made to the descriptions set forth above without departing from the inventive scope which is defined by the following claims.

What is claimed is:

1. A method of fabricating an electronic device formed on a semiconductor wafer, comprising the steps of:
    forming a dielectric layer in a fixed position relative to the wafer, the dielectric layer comprising an atomic concentration of each of silicon, carbon, and oxygen;
    after the forming step, exposing the electronic device to a plasma such that the atomic concentration of carbon in a portion of the dielectric layer is increased and the atomic concentration of oxygen in a portion of the dielectric layer is decreased; and
    after the exposing step, forming a barrier layer adjacent at least a portion of the dielectric layer.

2. The method of claim 1 wherein the exposing step comprises exposing the electronic device to a plasma comprising helium and hydrogen.

3. The method of claim 1 wherein the exposing step comprises exposing the electronic device to a plasma comprising helium and H$_2$.

4. The method of claim 3 wherein the plasma comprises approximately 95% of helium and approximately 5% of H$_2$.

5. The method of claim 1 wherein the exposing step comprises:
    applying a power of at least 100 Watts to a pedestal supporting the wafer; and
    at a same time as the applying step, exposing the electronic device to a plasma comprising helium and hydrogen.

6. The method of claim 1 wherein the exposing step comprises:
    applying a power in a range between 100 and 500 Watts to a pedestal supporting the wafer; and
    at a same time as the applying step, exposing the electronic device to a plasma comprising helium and hydrogen.

7. The method of claim 1 and further comprising:
    forming a conductor in a fixed position relative to the wafer and prior to the step of forming a dielectric layer such that the step of forming a dielectric layer forms the dielectric layer such that the conductor is positioned between the wafer and the dielectric layer; and
    forming a void in the dielectric layer prior to the exposing step, wherein the void extends through the dielectric layer and exposes a portion of the conductor.

8. The method of claim 7 and further comprising, after the step of forming a void and prior to the step of exposing the electronic device to a plasma, exposing the electronic device to argon.

9. The method of claim 7 wherein the step of forming a barrier layer comprises forming a metal barrier layer.

10. The method of claim 9 wherein the metal barrier layer comprises tantalum.

11. The method of claim 9 and further comprising, after the step of forming a barrier layer, a step of forming a metal layer adjacent the barrier layer.

12. The method of claim 11 wherein the step of forming a metal layer comprises forming a copper layer.

13. The method of claim 12 and further comprising, after the step of forming a barrier layer and before the step of forming a metal layer, forming a metal seed layer.

14. The method of claim 13:
    wherein the metal seed layer comprises forming a copper seed layer; and
    wherein the step of forming a copper layer comprises plating the copper layer.

15. The method of claim 11 and further comprising a step of planarizing the metal layer, a portion of the metal barrier layer, and a portion of the dielectric layer.

16. The method of claim 1 wherein the dielectric layer comprises a first dielectric layer, and further comprising, prior to the exposing step, a step of forming a second dielectric layer in a fixed position relative to the first dielectric layer such that the first dielectric layer is positioned between the second dielectric layer and the wafer, the second dielectric comprising an atomic concentration of each of silicon, carbon, and oxygen.

17. The method of claim 16 wherein, in response to the exposing step, the atomic concentration of carbon in a portion of the second dielectric layer is increased and the atomic concentration of oxygen in a portion of the second dielectric is decreased.

18. The method of claim 17 wherein the exposing step comprises exposing the electronic device to a plasma comprising helium and hydrogen.

19. The method of claim 17 wherein the exposing step comprises exposing the electronic device to a plasma comprising helium and H$_2$.

20. The method of claim 19 wherein the plasma comprises approximately 95% of helium and approximately 5% of H$_2$.

21. The method of claim 17 wherein the exposing step comprises:
    applying a power of at least 100 Watts to a pedestal supporting the wafer; and
    at a same time as the applying step, exposing the electronic device to a plasma comprising helium and hydrogen.

22. The method of claim 17 wherein the exposing step comprises:
    applying a power in a range between 100 and 500 Watts to a pedestal supporting the wafer; and
    at a same time as the applying step, exposing the electronic device to a plasma comprising helium and hydrogen.

23. The method of claim 17 and further comprising:

forming a conductor in a fixed position relative to the wafer and prior to the step of forming a first dielectric layer such that the step of forming a first dielectric layer forms the first dielectric layer such that the conductor is positioned between the wafer and the first dielectric layer; and forming a void in the first and second dielectric layers prior to the exposing step, wherein the void extends through the first and second dielectric layers and exposes a portion of the conductor.

24. The method of claim 23 and further comprising, after the step of forming a void and prior to the step of exposing the electronic device to a plasma, exposing the electronic device to argon.

25. The method of claim 24 wherein the step of forming a barrier layer comprises forming a metal barrier layer.

26. The method of claim 25 wherein the metal barrier layer comprises tantalum.

27. The method of claim 25 and further comprising, after the step of forming a barrier layer, a step of forming a metal layer adjacent the barrier layer.

28. The method of claim 27 wherein the step of forming a metal layer comprises forming a copper layer.

29. The method of claim 26 and further comprising, after the step of forming a barrier layer and before the step of forming a metal layer, forming a metal seed layer.

30. The method of claim 29:

wherein the metal seed layer comprises forming a copper seed layer; and wherein the step of forming a copper layer comprises plating the copper layer.

31. The method of claim 1 wherein the step of forming a barrier layer comprises forming a metal barrier layer.

32. The method of claim 31 wherein the metal barrier layer comprises tantalum.

33. The method of claim 31 and further comprising, after the step of forming a barrier layer, a step of forming a metal layer adjacent the barrier layer.

34. The method of claim 33 wherein the step of forming a metal layer comprises forming a copper layer.

35. The method of claim 34 and further comprising, after the step of forming a barrier layer and before the step of forming a metal layer, forming a metal seed layer.

36. The method of claim 35:

wherein the metal seed layer comprises forming a copper seed layer; and of forming a copper layer comprises plating the copper layer.

37. The method of claim 33 and further comprising a step of planarizing the metal layer, a portion of the metal barrier layer, and a portion of the dielectric layer.

38. A method of fabricating an electronic device formed on a semiconductor wafer, comprising the steps of:

forming a dielectric layer in a fixed position relative to the wafer, the dielectric layer comprising silicon, carbon, and oxygen;

after the forming step, exposing the electronic device to a plasma comprising helium and hydrogen; and after the exposing step, forming a barrier layer adjacent at least a portion of the dielectric layer.

39. The method of claim 38 wherein the exposing step comprises:

applying a power of at least 100 Watts to a pedestal supporting the wafer; and at a same time as the applying step, exposing the electronic device to a plasma comprising helium and hydrogen.

40. The method of claim 39 and further comprising:

forming a conductor in a fixed position relative to the water and prior to the step of forming a dielectric layer such that the step of forming a dielectric layer forms the dielectric layer such that the conductor is positioned between the wafer and the dielectric layer; and forming a void in the dielectric layer prior to the exposing step, wherein the void extends through the dielectric layer and exposes a portion of the conductor.

41. The method of claim 40 and further comprising, after the step of forming a void and prior to the step of exposing the electronic device to a plasma, exposing the electronic device to argon.

42. The method of claim 41 wherein the step of forming a barrier layer comprises forming a metal barrier layer.

43. The method of claim 42 and further comprising, after the step of forming a barrier layer, a step of forming a metal layer adjacent the barrier layer.

44. The method of claim 43 wherein the step of forming a metal layer comprises forming a copper layer.

45. The method of claim 44 and further comprising, after the step of forming a barrier layer and before the step of forming a metal layer, forming a metal seed layer.

46. The method of claim 45:

wherein the metal seed layer comprises forming a copper seed layer; and wherein the step of forming a copper layer comprises plating the copper layer.

47. The method of claim 43 and further comprising a step of planarizing the metal layer, a portion of the metal barrier layer, and a portion of the dielectric layer.

* * * * *